(12) United States Patent
Kassovski et al.

(10) Patent No.: US 6,765,209 B1
(45) Date of Patent: Jul. 20, 2004

(54) IR SENSOR WITH ENHANCED ELECTRICAL INTERFERENCE PROTECTION

(75) Inventors: Viktor V. Kassovski, Bulgaria Sofia (BG); Steven J. Verlinden, Aarschot (BE); Roger V. Diels, Erps-Kwerps (BE)

(73) Assignee: Melexis NV, Ypres (BE)

( * ) Notice: Subject to any disclaimer, the term of this patent is extended or adjusted under 35 U.S.C. 154(b) by 348 days.

(21) Appl. No.: 10/041,956

(22) Filed: Oct. 18, 2001

(51) Int. Cl.[7] .................................................. G01J 5/02

(52) U.S. Cl. .................................................. 250/338.1

(58) Field of Search ....................................... 250/338.1

(56) References Cited

U.S. PATENT DOCUMENTS

| | | | |
|---|---|---|---|
| 4,365,896 A | | 12/1982 | Mihalow |
| 4,393,347 A | * | 7/1983 | Looper ........................ 324/126 |
| 4,435,093 A | | 3/1984 | Krause et al. |
| 4,560,874 A | | 12/1985 | Cinzori et al. |
| 5,200,624 A | | 4/1993 | Pederson, Jr. et al. |
| 5,531,377 A | | 7/1996 | Thayer et al. |
| 5,946,177 A | | 8/1999 | Miller et al. |

* cited by examiner

*Primary Examiner*—Constantine Hannaher
(74) *Attorney, Agent, or Firm*—Gerald T. Gray; Townsend and Townsend and Crew LLP

(57) ABSTRACT

An IR sensing device including a sensing element configured as a three terminal device, a differential signal processing circuit and an electrical connection to the conductive housing.

15 Claims, 3 Drawing Sheets

IR SENSOR WITH ENHANCED ELECTRICAL INTERFERENCE PROTECTION

BACKGROUND OF THE INVENTION

The present invention relates in general to infrared (IR) sensing devices and more particularly to IR sensing devices including circuitry configured to protect the operation of the IR sensing device in an electrically hostile environment.

IR sensors are used to measure temperatures of remote objects by detecting the infrared radiation emitted from the target object. In a typical configuration, IR radiation enters the housing in which the sensor element is located through an IR transparent window and impinges upon the sensing element. The temperature is typically measured by detecting the IR radiation and determining its effect on a thermally isolated radiation absorbing area of the sensing element. The sensing element produces an electrical signal representing the temperature of the target object and which varies with the impinging radiation. This electrical signal is processed and amplified by electronic processing circuitry. The signals are small in amplitude and the sensor is therefore susceptible to the effects of EMC and ESD and also to leakage in protection circuitry.

A typical arrangement of the electronic processing and protection circuitry coupled to a sensing element is shown in FIG. 1. A thermal sensing element 101 is connected to processing circuit 110 via connection lines 112 and 113 as shown. Processing circuit 110 amplifies and processes the signal from sensing element 101 so as to produce a temperature readout signal 107. Sensing element 101 is also connected to protection circuit elements 102, 103, 104 and 105 via connection lines 112 and 113 as shown. Typically, sensing element 101 has one end connected to a ground, or earth, terminal shown here as connection 106. Sensing element 101 typically includes a number of thermopile elements in series with a combined series impedance on the order of tens of [Kohm] kΩ. The connections 112 and 113 between the two ends of the series of thermopile elements and the processing circuit are normally protected at one or even both ends against static damage and incoming EMC radiation by protection circuits 102, 103, 104, and 105, which are arranged such as to limit the voltage excursions of the connections using diode structures connected to the power supply rails. The diodes are typically configured to conduct when the voltage on the pins exceeds the power rail voltage by the diode voltage.

Such protection structures, even when not operating, have an inherent leakage current, and when the external impedance is high, e.g., on the order of tens of [Kohm] kΩ, the leakage current generates an error voltage superimposed on the desired signal voltage generated by the sensor.

It is therefore desirable to provide IR sensing devices including circuitry that protects the sensing device from electrical interference in an electrically hostile environment and which has reduced leakage.

BRIEF SUMMARY OF THE INVENTION

The present invention provides infrared (IR) sensing devices including circuitry configured to protect the sensing device from electrical interference in an electrically hostile environment and which has reduced leakage.

According to the invention, an IR sensing device includes a sensing element configured as a three terminal device, a differential signal processing circuit and an electrical connection to the conductive housing.

According to an aspect of the present invention, an Infra Red (IR) sensing device is provided that typically comprises an IR sensing element for detecting IR radiation, wherein the IR sensing element includes a plurality of thermopile elements with connections to both ends and to its center point, a processing circuit coupled to the IR sensing element configured to receive and analyze the electrical signals generated by the IR sensing element, wherein the processor connects the center point of the sensing element to a first potential and analyzes the signals from the ends of the sensing element as a differential pair of signals. The device also typically includes protection circuitry associated with the inputs to the processing circuit from the sensing element that connect only to the inputs and the first potential, and an electrically conducting housing connected to the first potential.

According to another aspect of the present invention, an Infra Red (IR) sensing device is provided that typically comprises an IR sensing element for detecting IR radiation, wherein the IR sensing element includes a plurality of serially connected thermopile elements, a processing circuit configured to receive and process the electrical signals generated by the thermopile elements, the processing circuit having first and second inputs coupled to the two ends of the series of thermopile elements and a third input coupled to a center point of the series of thermopile elements and to a first potential, and protection circuitry coupled to the two inputs and the first potential. In operation, the processing circuit typically processes the signals at the first and second inputs as a differential pair of signals relative to the first potential so as to produce a temperature readout signal.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DETAILED DESCRIPTION OF THE INVENTION

Figure 1:
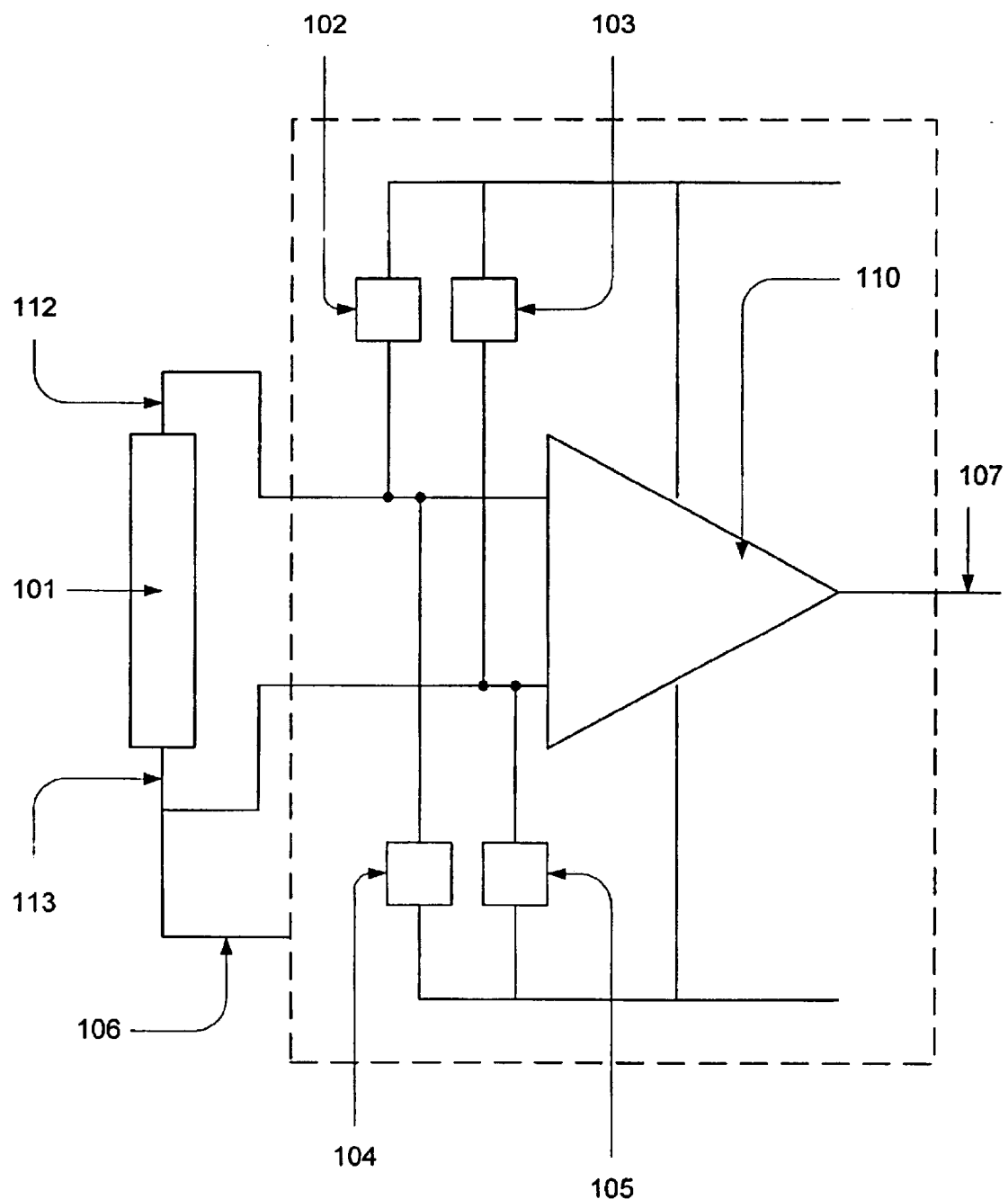
FIG. 1 is a schematic diagram of a typical IR sensor arrangement.
Figure 2:
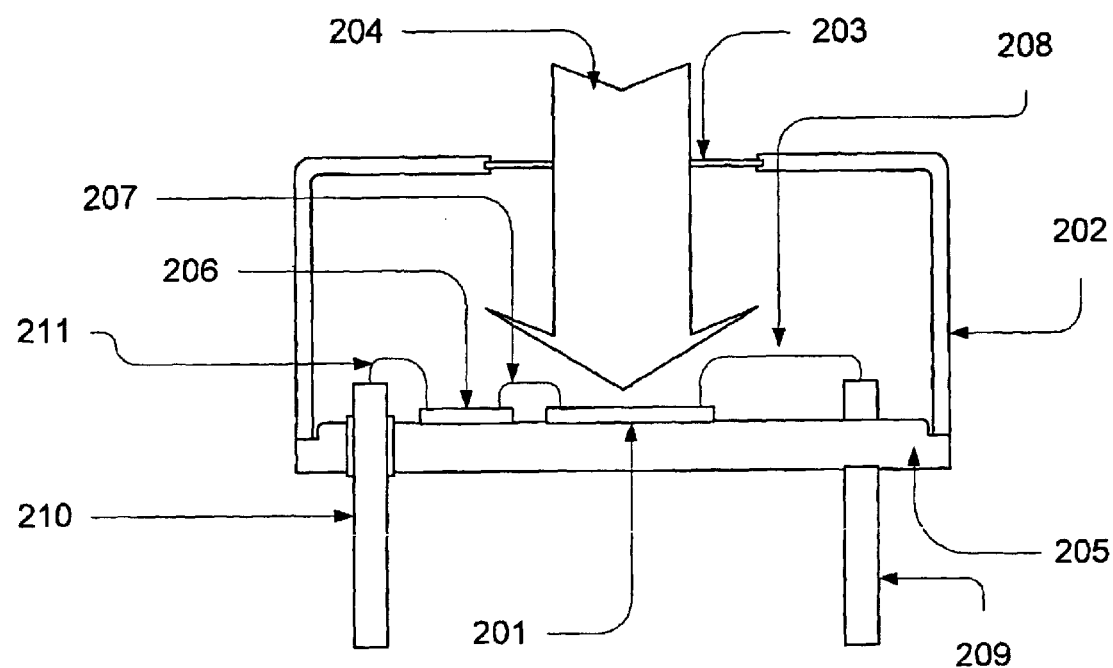
FIG. 2 is a sectional schematic diagram showing an arrangement of elements of an IR sensing device according to an embodiment of the present invention.

IR sensors are used to measure temperatures of remote objects by detecting the infrared radiation emitted from the target object. FIG. 2 illustrates an IR sensing device arrangement according to one embodiment of the present invention. As shown, IR radiation 204 enters the housing 202 in which a sensor element 201 is located through an IR transparent window 203, and impinges upon the sensing element 201. The temperature is measured by determining the effect of the IR radiation on a thermally isolated radiation absorbing area of the sensing element. The sensing element typically produces an electrical signal that is proportional to and varies with the impinging radiation. This electrical signal is processed by electronic circuitry 206 shown mounted on the same baseplate 205 of the housing 202. The signals are typically small in amplitude and the sensor is therefore susceptible to the effects of EMC and ESD and also to leakage in the protection circuitry.

Figure 3:
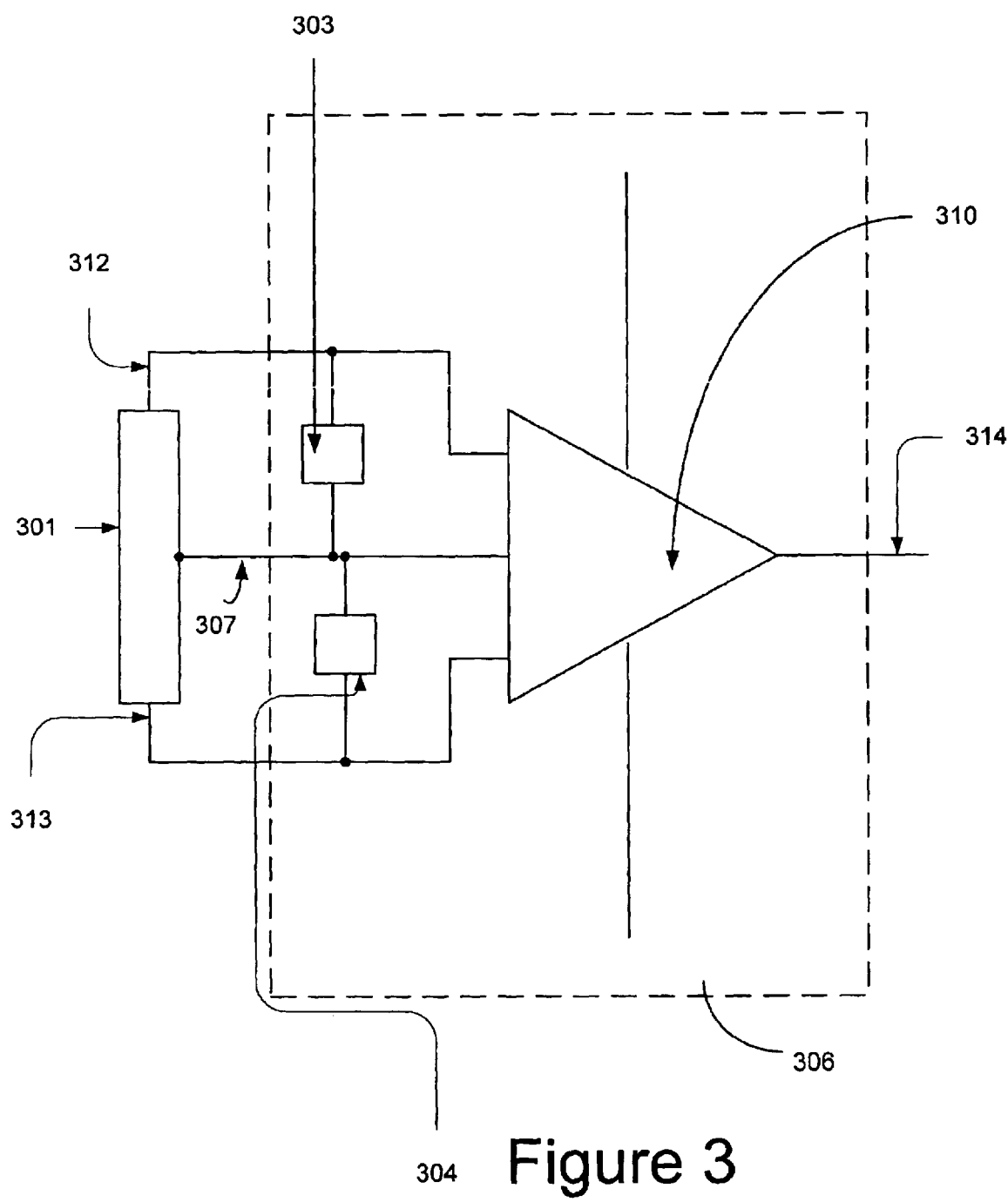
FIG. 3 is a schematic diagram showing a sensor arrangement according to an embodiment of the present invention.

According to one embodiment of the present invention, as shown schematically in FIG. 3, a sensing element 301 generates a voltage signal across the extremities 312 and 313, which is a function of the received radiant energy. Preferably sensing element 201 includes a plurality of serially connected thermopile elements as is well known, with lines 312 and 313 connecting to opposite ends of the serially connected thermopile elements. The voltage signal is received over lines 312 and 313 and amplified and processed by electronic processing circuit 310 so as to produce a digital temperature readout signal on line 314. There is also an additional connection 307 to a point substantially in the center of the string of serially connected thermopile elements of sensing element 301. Connection 307 is electrically connected to the substrate of the silicon chip (e.g., element 201 of FIG. 2) on which the sensing element 301 is fabricated. Connection 307 is further electrically connected to the substrate of the silicon chip 306 (e.g., element 206 of FIG. 2) on which the electronic processing circuit 310 is implemented as a single integrated circuit. Connection 307 is further electrically connected to the protection circuitry elements 303 and 304 on the silicon chip 306 on which the electronic processing circuit 310 is implemented. Connection 307 is farther electrically connected to the base of the housing (e.g., base 205 of the housing 202 in FIG. 2). Preferably, as shown in FIG. 2, a bond wire 208 makes the connection between the sensing element 201 and a pin 209 in intimate contact with the base 205. Similarly, pin 210 provides a connection to ground for processing circuit silicon chip 206 via bond wire 211. Other techniques for making these connections are well known and can include, for example, a bond wire direct from the sensing element 201 to the base 205, the use of conducting adhesives when fixing the sensing element chip 201 and/or the processing circuit silicon chip 206 down to the base 201.

The signals generated by the sensing element 301 are small in magnitude, e.g., typically between about 10 microvolts/° C. and about 100 microvolts/° C., and more typically approximately 50 microvolts/° C. In a conventional arrangement, the leakage currents associated with the protection circuit elements at the inputs to the processing circuitry would have leakage currents of between 1 and 10 nA. These leakage currents combined with the impedance of the thermopile elements at typically 50 kΩ would give unwanted error voltages between about 50 and about 500 microvolts, equivalent to an error of about 1 to about 10° C. In one embodiment of the present invention, the protection circuit elements 303 and 304 are advantageously connected to the reference connection 307, and not the power supply. Protection circuit elements 303 and 304 each preferably include a diode element. The magnitude of the signals from the radiation sensing element 301 is small and the diodes in this region of their operating curve have a leakage that is much smaller and substantially linear with voltage and is preferably compensated for by adjustments to the gain in the ensuing electronic processing circuitry (e.g., element 310 or other element). The desired signal is also differentially distributed around the reference line 307 that is connected to the local zero volts or ground line, thereby providing improved immunity to EMC interference. The conducting housing is also connected to the reference or ground pin, which provides improved immunity to ESD interference.

The combination of the center tapped sensing element, the fully differential zero voltage centered processing circuitry and the screening effects provided by the connection to conducting parts of the housing advantageously provide an IR sensing device with enhanced performance and protection from the electrical environment.

Additional processing circuitry for any of the above implementations can include analogue and/or digital circuitry for configuring, calibrating and/or controlling operation of the sensor. Memory, such as non-volatile memory is also preferably included. Such non-volatile memory is used in some embodiments as storage for look up tables or other constants and configuration parameters that are used for optimization and calibration of the sensing devices. In one digital implementation, a microprocessor is used as both a control and processing circuit, and can further be integrated with a memory, such as a non volatile memory unit. Memory may be programmed before manufacture, after manufacture of the sensor, or after installation of the sensor in an operating location.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An Infra Red (IR) sensing device comprising:
   an IR sensing element for detecting IR radiation, wherein the IR sensing element includes a plurality of thermopile elements with connections to both ends and to a center point of the sensing element;
   a processing circuit having two inputs coupled to the IR sensing element and a third input, the processing circuit being configured to receive and analyze the electrical signals generated by the IR sensing element;
   protection circuitry coupled to the two inputs and a first potential; and
   an electrically conducting housing connected to the first potential,
   wherein the third input of the processing circuit is connected to the center point of the sensing element and to the first potential and wherein the ends of the sensing element are connected to the two inputs, wherein the processing circuit analyzes the signals from the ends of the sensing element as a differential pair of signals relative to the first potential.

2. The device of claim 1, wherein the processing circuit is embodied as an integrated circuit.

3. The device of claim 2, wherein the first potential is connected to the substrate of the integrated circuit.

4. The device of claim 1, wherein the processing circuit includes configuration circuitry.

5. The device of claim 1, wherein the processing circuit includes calibration circuitry.

6. The device of claim 4 or 5, wherein the processing circuit includes a non-volatile memory for storing calibration or configuration data.

7. The device of claim 6, wherein the non-volatile memory is programmed after manufacture.

8. The device of claim 6, wherein the non-volatile memory is programmed after the device has been installed in its operating location.

9. An Infra Red (IR) sensing device comprising:

an IR sensing element for detecting IR radiation, wherein the IR sensing element includes a plurality of serially connected thermopile elements;

a processing circuit configured to receive and process the electrical signals generated by the thermopile elements, the processing circuit having first and second inputs coupled to the two ends of the series of thermopile elements and a third input coupled to a center point of the series of thermopile elements and to a first potential; and protection circuitry coupled to the two inputs and the first potential;

wherein the processing circuit processes the signals at the first and second inputs as a differential pair of signals relative to the first potential so as to produce a temperature readout signal.

10. The sensing device of claim 9, further comprising an electrically conducting housing connected to the first potential.

11. The sensing device of claim 9, wherein the protection circuitry includes a pair of diode structures, each diode structure coupled to the first potential and to one of the first and second inputs.

12. The sensing device of claim 9, wherein the processing circuit is implemented on a first integrated circuit.

13. The sensing device of claim 12, wherein the sensing element is implemented on a second integrated circuit.

14. The sensing device of claim 12, wherein the protection circuitry is implemented on the first integrated circuit.

15. The sensing device of claim 9, further comprising a conductive housing connected to the first potential.

* * * * *